United States Patent
Oh

(10) Patent No.: US 6,985,398 B2
(45) Date of Patent: Jan. 10, 2006

(54) MEMORY DEVICE HAVING MULTIPLE ARRAY STRUCTURE FOR INCREASED BANDWIDTH

(75) Inventor: Jong-Hoon Oh, Chapel Hill, NC (US)

(73) Assignee: Infineon Technologies AG, Munich (DE)

( * ) Notice: Subject to any disclaimer, the term of this patent is extended or adjusted under 35 U.S.C. 154(b) by 35 days.

(21) Appl. No.: 10/672,120

(22) Filed: Sep. 26, 2003

(65) Prior Publication Data

US 2005/0078542 A1 Apr. 14, 2005

(51) Int. Cl.
*G11C 8/00* (2006.01)

(52) U.S. Cl. .............. 365/230.03; 365/233; 365/230.06
(58) Field of Classification Search ............ 365/230.03, 365/233, 230.06
See application file for complete search history.

(56) References Cited

U.S. PATENT DOCUMENTS

| | | | |
|---|---|---|---|
| 5,060,145 A | 10/1991 | Scheuneman et al. | |
| 5,950,219 A | 9/1999 | Rao | |
| 5,995,438 A | 11/1999 | Jeng et al. | |
| 6,026,466 A | 2/2000 | Su et al. | |
| 6,088,293 A * | 7/2000 | Ho ......................... | 365/230.03 |
| 6,154,414 A | 11/2000 | Lee | |
| 6,240,046 B1 * | 5/2001 | Proebsting .................. | 365/233 |
| 6,278,648 B1 | 8/2001 | Cowles et al. | |
| 6,310,814 B1 * | 10/2001 | Hampel et al. ........ | 365/230.03 |
| 6,373,752 B1 * | 4/2002 | Wright et al. .......... | 365/230.06 |
| 6,449,685 B1 | 9/2002 | Leung | |
| 6,529,429 B2 | 3/2003 | Cowles et al. | |
| 6,567,338 B1 | 5/2003 | Mick | |

FOREIGN PATENT DOCUMENTS

EP  0 303 811  2/1989

* cited by examiner

*Primary Examiner*—Huan Hoang
(74) *Attorney, Agent, or Firm*—Dicke, Billig & Czaja, PLLC

(57) ABSTRACT

One embodiment of the present invention provides a semiconductor memory including a bank of N memory arrays each having a corresponding array address, a bus providing an array address signal, a row address signal (RAS), and timing signals. The semiconductor memory further includes N tracking circuits each coupled between a different one of the N memory arrays and the bus. A first tracking circuit, in response to receiving a first array address for a first array via the array address signal and a first active state of the RAS, couples the first array to the bus such that only the first array responds to a first sequence of timing signals constituting a first bank transaction. A second tracking circuit, in response to receiving a second array address for a second array via the array address signal and a second active state of the RAS, couples the second array to the bus such that only the second array begins responding to second sequence of timing signals constituting a second bank transaction before the first bank transaction is complete.

34 Claims, 9 Drawing Sheets

MEMORY DEVICE HAVING MULTIPLE ARRAY STRUCTURE FOR INCREASED BANDWIDTH

BACKGROUND

Conventional semiconductor memory devices utilizing multiple array memory structures, such as synchronous dynamic random access memory (SDRAM) devices employing bank structures, often employ pipelining-type operations among different banks to enhance performance, but generally do not support pipelining-type operations within a given bank. This "limitation" is due primarily to the use of global timing signals which require that transactions to a given bank be successive in nature, such that a transaction with a first memory array of the given bank be completed before a transaction with a second memory array of the given bank can be initiated.

FIG. 1 is a block diagram illustrating generally an example bank structure of a conventional multiple array memory system 30. As illustrated, a plurality of memory arrays, indicated as memory arrays 32m to 32n, together form a memory array bank 34. Memory system 30 further includes a bank controller 36 that provides global array and row address signals and global timing signals, such as row address signals (RAS) and wordline on signals, via a row bus 38, and global column address and timing signals, such as column address signals (CAS), via a column bus 40.

Each memory array of memory array bank 34 is coupled to row bus 38 via a corresponding row control block, indicated as 42m to 42n, and to column bus 40 via a column redundancy and control block 44 and a column decoder 46. Each memory array is further coupled to a data input/output (I/O) block 48 via global data buses 50a and 50b.

To access a memory array within memory array bank 34, such as memory array 32m, bank controller 36 first "activates" array 32m by providing the proper array address via row bus 38. Once array 32m is activated, bank controller 36 provides via row bus 38 a subsequent series of global timing signals to carry out the desired access operation, such as a word-line selection (WL) signal, a bit-line sense-amp (BL S/A) control signal, etc. The subsequent series of timing signals are provided to each memory array 32m to 32n of bank 34 via corresponding row control blocks 42m to 42n; however, only the activated array, in this case array 32m, responds to the subsequent series of timing signals.

Because of the global nature of the timing signals, the access operation of array 32m must be complete before an access operation to another array, such as array 32n, can be initiated. Otherwise, if array 32n is activated prior to completion of the access operation of array 32m, both arrays would respond to the subsequent global timing signals and result in an erroneous multiple array operation due to wrongful timing signal inputs.

FIG. 2 is an exemplary timing diagram 60 illustrating generally transactions of a conventional multiple array memory system, such as memory system 30 of FIG. 1. In the illustrative example, a system clock is illustrated at 62 and command row 64 illustrates system commands in SDRAM form.

Bank controller 36 first issues a "bank activate" command 68. As illustrated, bank activate command 68 (Act_Bk<a>) activates memory array bank "a." Memory array <m> 32m within memory array bank <a> is then activated for a row operation as indicated by row operation period 68. An operation to a selected row of memory array <m> 32m, such as a read or a write operation, is then initiated as indicated at 70. Upon completion of the read or write operation 70, a precharge command 72 for memory array bank <a> is initiated. Subsequently, memory array <m> 32m is precharged, as indicated by precharge period 74. The total cycle time tRC for the transaction to a row within memory array <m> 32m of memory array bank <a>, including row operation period 68 and precharge period 74, is indicated at 76.

As indicated at 78, a next bank activate command Act_Bk<a> cannot be issued to memory array bank <a> until after the total cycle time tRC 76 has elapsed. After this time, another transaction can take place within memory array bank <a>, such as a row operation to memory array <n> as indicated at 80. Command row 82 illustrates commands for a similar operation in an SRAM-like (Static Random Access Memory) form.

As illustrated above, because of the global nature of the timing signals, a transaction to first memory array of a bank must be completed before a transaction to another memory array of the bank is initiated to avoid an ambiguous output situation where more than one memory array in a bank responds to a same sequence of timing signals. As a result, the bandwidth of a conventional multiple array memory bank structure is restricted by the global nature of the memory system timing signals.

SUMMARY

One embodiment of the present invention provides a semiconductor memory including a bank of N memory arrays each having a corresponding array address, a bus providing an array address signal, a row address signal (RAS), and timing signals. The semiconductor memory further includes N tracking circuits each coupled between a different one of the N memory arrays and the bus. A first tracking circuit, in response to receiving a first array address for a first array via the array address signal and a first active state of the RAS, couples the first array to the bus such that only the first array responds to a first sequence of timing signals constituting a first bank transaction. A second tracking circuit, in response to receiving a second array address for a second array via the array address signal and a second active state of the RAS, couples the second array to the bus such that only the second array begins responding to second sequence of timing signals constituting a second bank transaction before the first bank transaction is complete.

DETAILED DESCRIPTION

In the following Detailed Description, reference is made to the accompanying drawings which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 3:
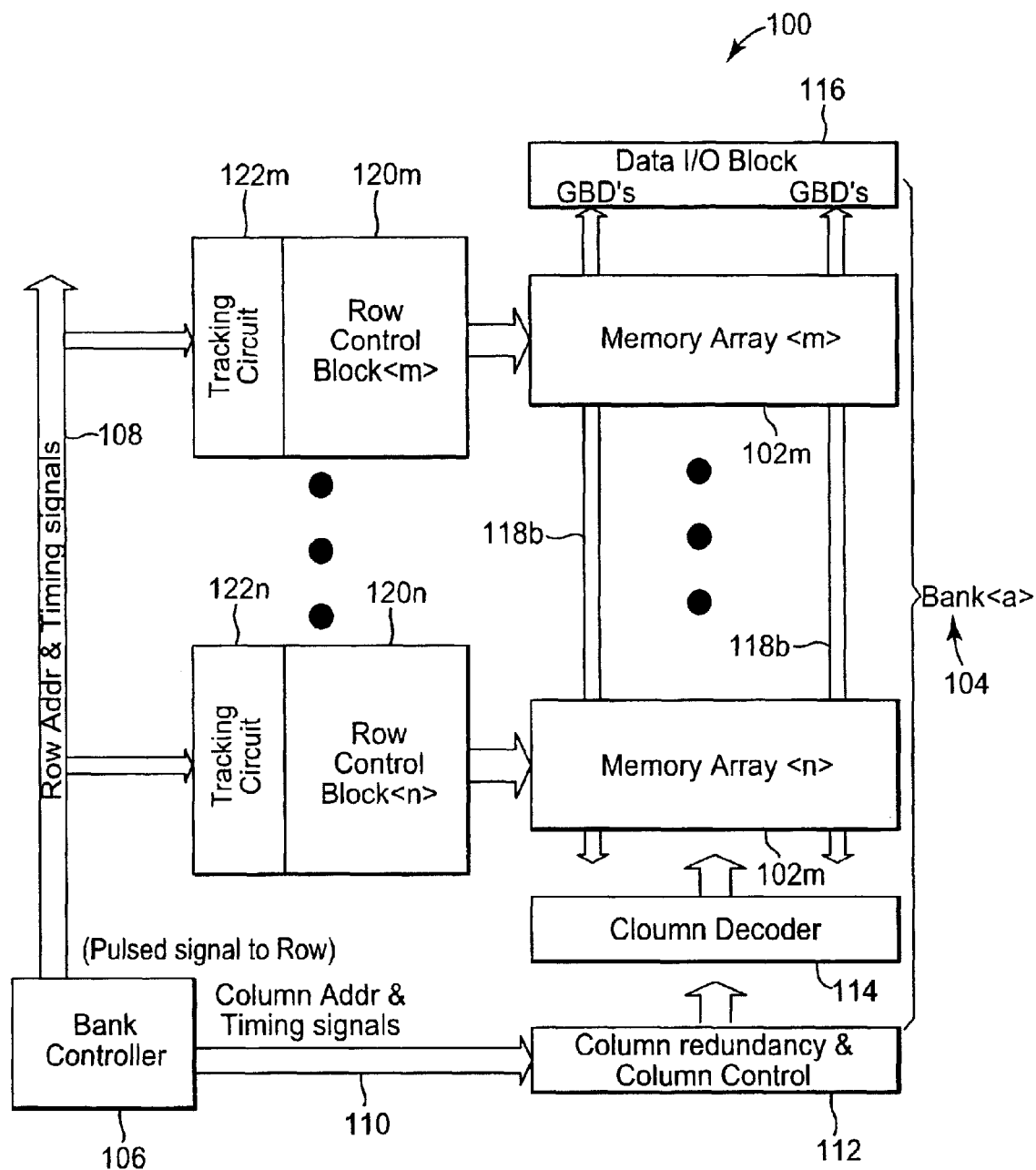
FIG. 3 is a block diagram illustrating generally one exemplary embodiment of a multiple array structure according to the present invention.

FIG. 3 is a block diagram illustrating generally one exemplary embodiment of a portion of a semiconductor memory device 100 having a banked memory array structure employing tracking circuits according to the present invention. The tracking circuits are configured to increase the bandwidth of memory device 100 by enabling overlapping bank transactions to different memory arrays within the bank. Memory device 100 includes a plurality of memory arrays, illustrated as memory arrays 102m to 102n which together form a memory array bank, illustrated as bank<a> at 104. A bank controller 106 provides global timing signals, such as array addresses, row addresses, and row address signals (RAS), via a row bus 108, and global column address and timing signals, such as column address signals (CAS), via a column bus 110.

Each memory array, 102m to 102n, of bank <a> 104 is coupled to column bus 110 via a column redundancy and control block 112 and a column decoder 114, and to a data input/output (I/O) block 116 via global data buses (GDB's) 118a and 118b. Each memory array, 102m to 102n, is further coupled to row bus 108 via a corresponding row control block, indicated as 120m to 120n, and a corresponding tracking circuit, indicated as 122m to 122n.

In one embodiment, a first tracking circuit, such as tracking circuit 122m, in response to receiving the array address for associated memory array <m> 102m and a subsequent first active state of a row address signal (RAS) via row bus 108, couples memory array <m> 102m to bus 108 such that only memory array <m> 102m responds to a subsequent first sequence of timing signals representing a first transaction of bank 104. Thereafter, a second tracking circuit, such as tracking circuit 122n, in response to receiving the array address for associated memory array 102n and a subsequent second active state of the RAS via row bus 108, couples memory array 102n such that only memory array 102n begins responding to a second sequence of timing signals representing a second transaction of bank 104 before the first transaction to memory array <m> 102m is complete. In particular, by enabling overlapping transactions to first and second memory arrays within bank <a> 104, such as memory arrays 102m and 102n, the tracking circuits, such as tracking circuits 122m and 122n, increase the bandwidth of semiconductor memory device 100 via data I/O block 116 and GBD's 118a and 118b.

In one embodiment, semiconductor memory device 100 comprises a DRAM device, wherein each of the memory arrays 102m to 102n comprises an array of DRAM memory cells. In one embodiment, the second transaction must be to a second memory array that is different from and not adjacent to the first memory array. Such is the case where semiconductor memory device 100 is structured in a manner wherein neighboring memory arrays share bit-line sense amplifiers (BL S/A's). In one embodiment, when the second transaction is to the first memory array or a neighboring memory array, the first tracking circuit provides a "wait" signal instructing the bank controller to delay the second transaction until after the first transaction is complete.

Figure 4:
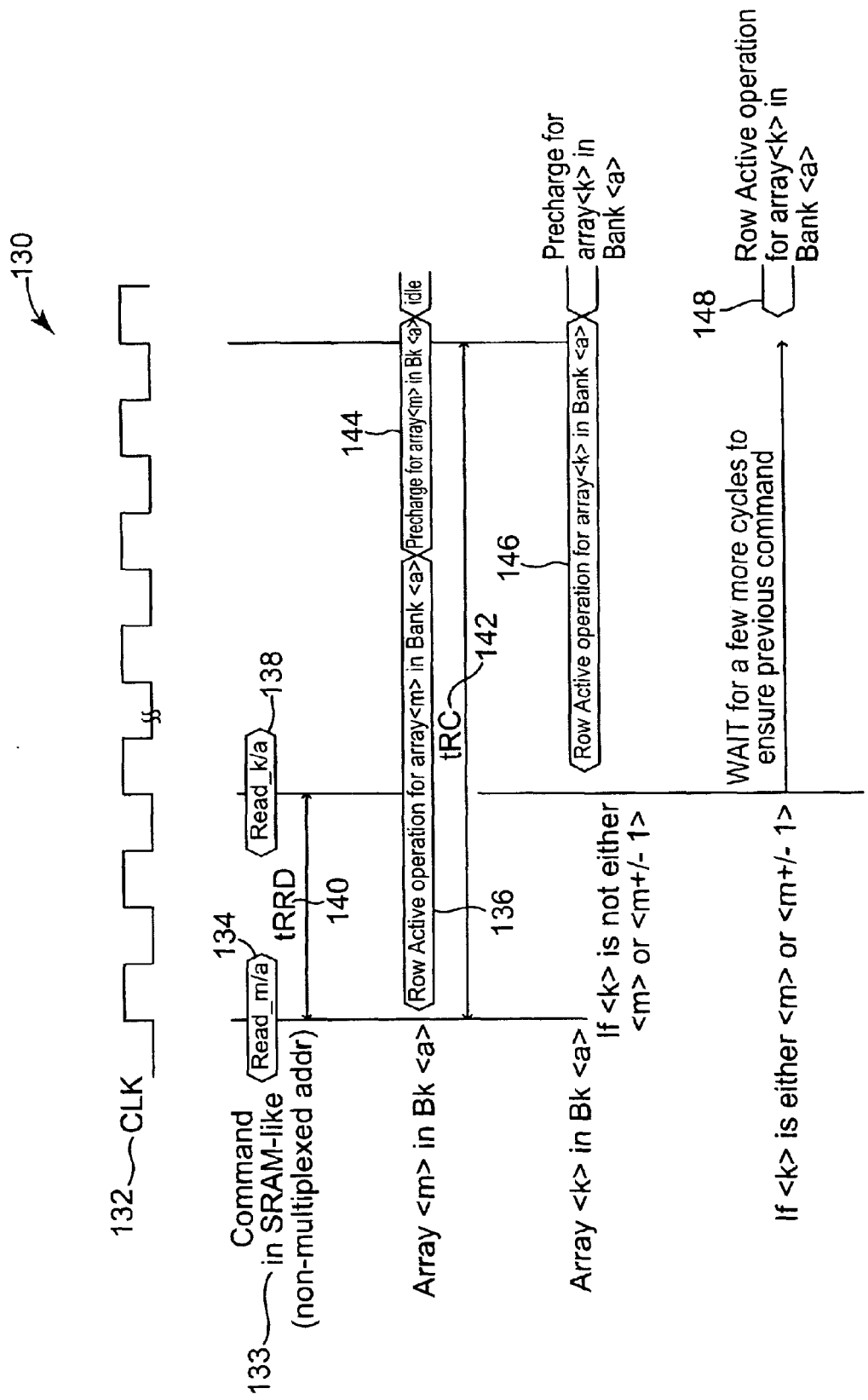
FIG. 4 is an exemplary timing diagram illustrating generally on example of the operation of a multiple array structure according to the present invention.

FIG. 4 is a timing diagram 130 illustrating generally an example of overlapping transactions to semiconductor memory device 100 of FIG. 3. In the illustrative example, a system clock is illustrated at 132 and row 133 illustrates SRAM-like (non-multiplexed addresses) system commands provided to bank controller 106 and their relationship to clock signal 132. As illustrated, bank controller 106 first responds to a read command of memory array <m> 102m within bank <a> 104 (Read__m/a), as indicated at 134, which initiates row active operations for memory array <m> 102m indicated at 136. In response, tracking circuit 122m couples memory array <m> 102m to bus 108 such that only memory array <m> 102m responds to a subsequent first sequence of timing signals provided via row bus 108 representing a first transaction of bank <a> 104. By coupling memory array <m> 102m to row bus 108 in this fashion, bank controller 106 can responds to a second read command to a second memory array, such as a "memory array <k>" as indicated at 138 (not shown in FIG. 3), after a time tRRD 140 without having to wait for a total cycle time tRC 142 required to complete the read transaction 134 of memory array <m> 102m, including a precharge operation 144.

Row active operations for memory array <k> are indicated at 146 when memory array <k> is different from and not a neighboring memory array of memory array <m> 102m. If memory array <k> is a neighboring array, bank controller 106 is instructed by tracking circuit 102m to wait the total cycle time tRC 144 for read transaction 134 of memory array <m> 102m to be completed before initiated row active operations of memory array <k> at 148.

Figure 5:
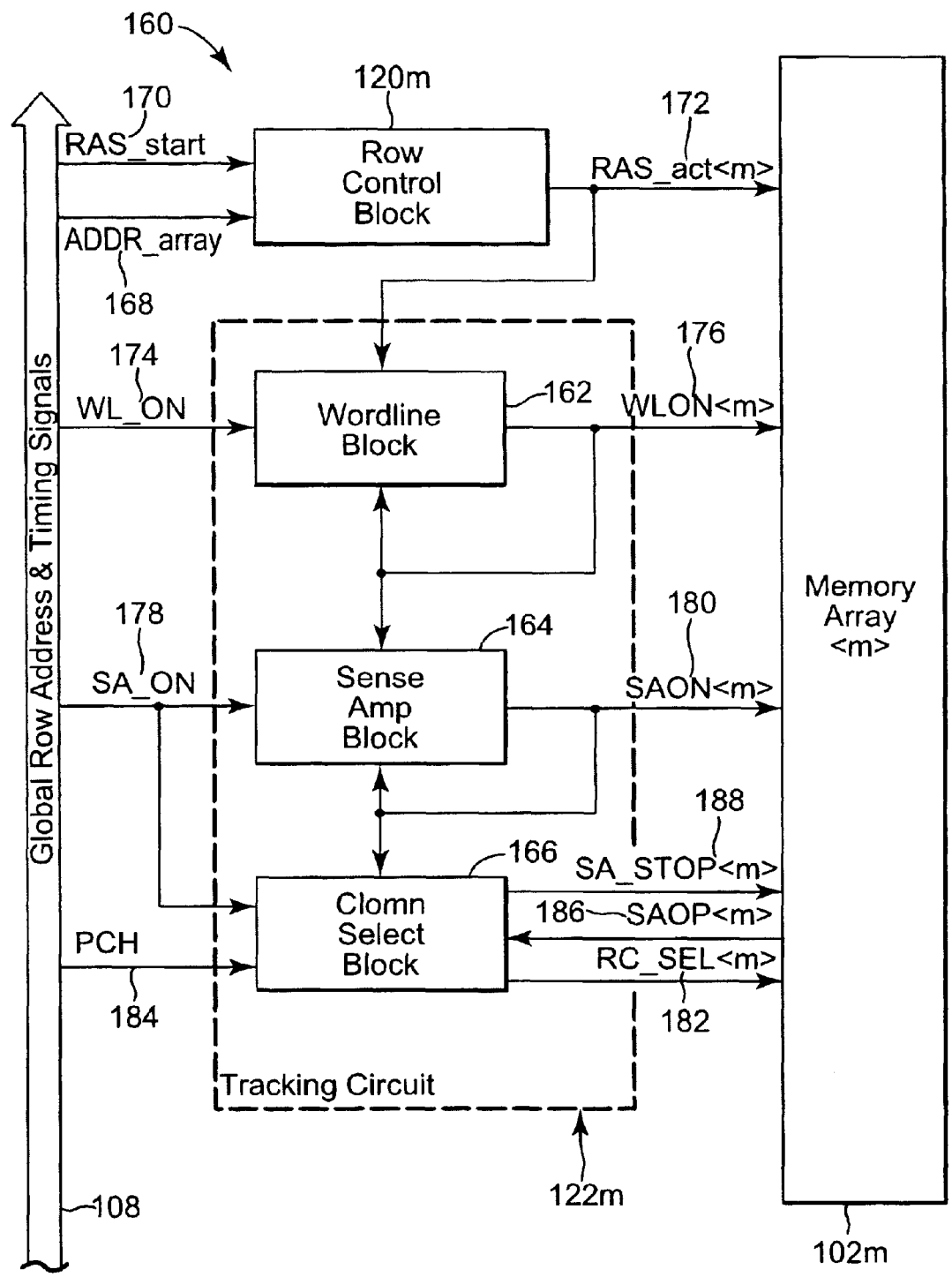
FIG. 5 is block diagram illustrating generally one exemplary embodiment of a tracing circuit according to the present invention.

FIG. 5 is a block diagram illustrating a portion of a semiconductor memory device 160 employing one exemplary embodiment of a tracking circuit, such as tracking circuit 122m, according to the present invention. Tracking circuit 122m includes a wordline block 162, a sense amp block 164, and a column select block 166.

Row control block 120m receives via row bus 108 a global array address signal at 168 and a global row address signal start pulse (RAS_start) at 170. In response to the array address signal having the address for associated memory array <m> 102m and RAS_start 170 having an active state, row control block provides a local row address signal active pulse (RAS_act<m>) at 172 to memory array <m> 102m and wordline block 162. RAS_act<m> 172 initiates a row operation to memory array <m> 102m.

Wordline block 162 generates a first tracking signal having an active state in response to receiving RAS_act<m> 172. Furthermore, wordline block 162, in response to the first tracking signal having the active state and upon receiving a global wordline on timing signal pulse (WL_ON) 174 via row bus 108, provides a local wordline on signal pulse (WLON<m>) at 176 to memory array <m> 102m and sense amp block 164. WLON<m> 176 causes a selected wordline within associated memory array <m> 102m to be activated. WLON<m> 176 further sets the first tracking signal to an inactive state.

Sense amp block 164 generates a second tracking signal having an active state in response to receiving WLON<m> 176. Additionally, sense amp block 164, in response to the second tracking signal having the active state and upon receiving a first pulse of global sense amplifier on timing signal (SA_ON) 178 via row bus 108, provides a local sense amplifier on pulse (SAON<m>) 180 to memory array <m> 102m and column select block 166. SAON<m> 180 initiates sense amp operations for memory array <m> 102m and further sets the second tracking signal to an inactive state.

Column select block 166 provides to memory array <m> 102m a column select signal (RC_SEL<m>) 182 having an active state in response to SAON<m> 180. RC_SEL<m> 182 initiates selection of a selected column within memory array <m> 102m based on a column address received via a column decoder, such as column decoder 46. SAON<m> 180 represents the earliest time at which column selection can be initiated. Based on the above description, only memory array <m> 102m responds to data transfer to/from a global data bus, such as global data buses 50a/50b.

Additionally, with RC_SEL<m> 182 at an active state and upon receiving either a second pulse of SA_ON 178 or a precharge timing signal pulse (PCH) 184 received via row bus 108, column select block 166 sets RC_SEL 182 to an inactive state. Column select block 166 further receives from memory array <m> 102m a sense amp operation tracking signal (SAOP<m>) 186. When both RC_SEL<m> 182 and SAOP<m> 186 have an inactive state, column select block 166 provides a sense amplifier stop signal (SA_STOP<m>) 188 to memory array <m> 102m. SA_STOP<m> 188 terminates sense amplifier operations associated with memory array <m> 102m.

Figure 6:
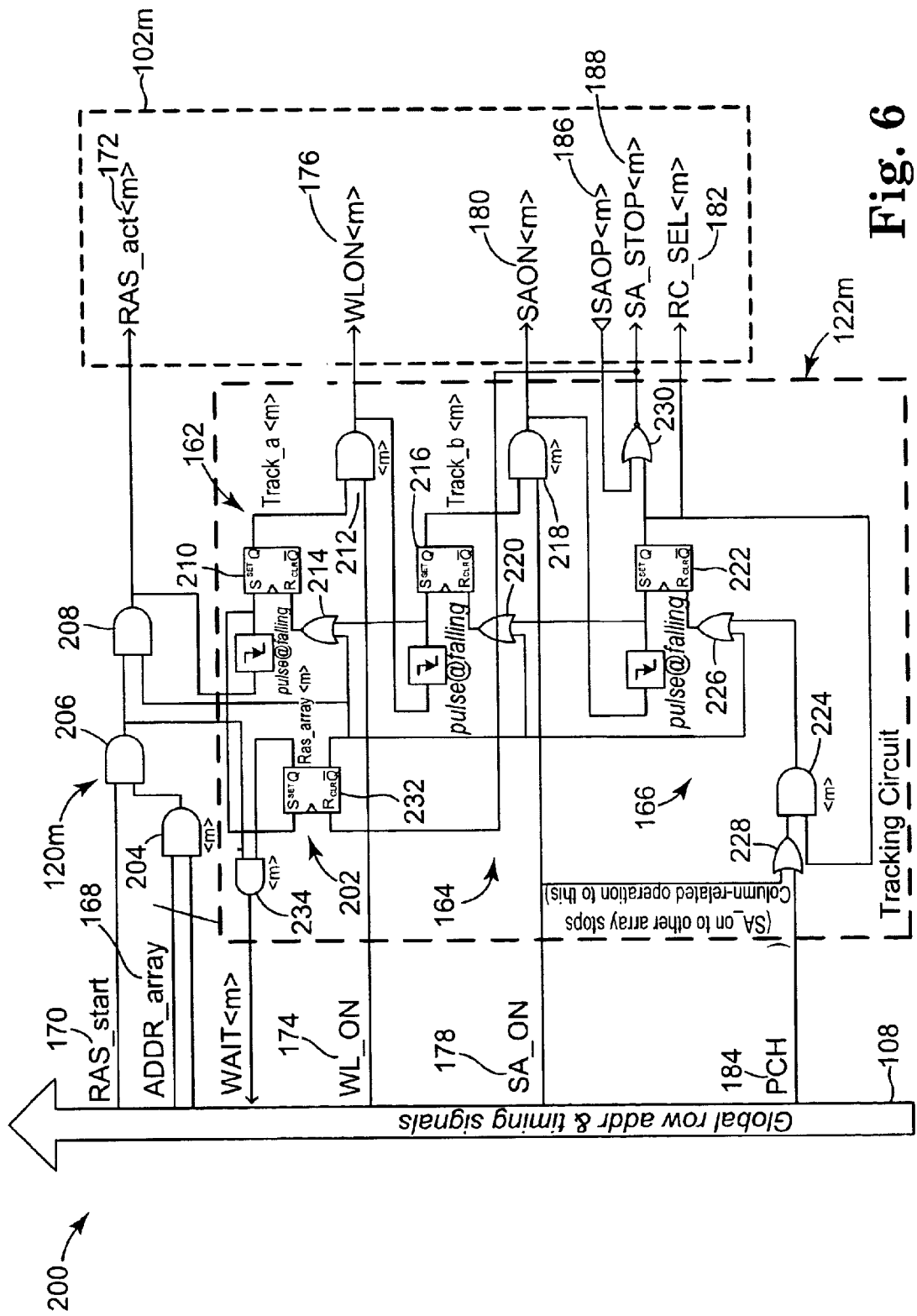
FIG. 6 is a schematic block diagram of one exemplary embodiment of a tracking circuit according to the present invention.

FIG. 6 is a schematic block diagram illustrating a portion of a semiconductor memory system 200 employing one exemplary embodiment of a tracking circuit, such as tracking circuit 122m, according to the present invention. Tracking circuit 122m includes wordline block 162, sense amp block 164, and column select block 166. As illustrated, tracking circuit 122m further includes a conflict block 202 which is configured to prevent consecutive transactions to the same array.

Row control block 120m includes AND-gates 204, 206 and 208. Wordline block 162 includes a flip-flop 210, an AND-gate 212, and an OR-gate 214. Sense amp block 164 includes a flip-flop 216, an AND-gate 218, and an OR-gate 220. Column select block 166 includes a flip-flop 222, an AND-gate 224, OR-gates 226 and 228, and a NOR-gate 230.

Row control block 120m receives a global array address signal (ADDR_array) 168 at the inputs of AND-gate 204. The output of AND-gate 204 and the global row address signal start pulse (RAS_start) 170 are received at the inputs of AND-gate 206. The inputs of AND-gate 208 are coupled to the output of AND-gate 206 and the Q' output of flip-flop 232 of conflict block 202. Local row address signal active pulse (RAS_act<m>) 172 is provided to memory array <m> 102m via the output of AND-gate 208.

Wordline block 162 receives RAS_act<m> 172 at the set input (S) of flip-flop 210 and generates the first tracking signal (Track_a<m>) at the Q output of flip-flop 210. Track_a<m> and the global wordline on timing signal pulse (WL_ON) 174 are received at the inputs of AND-gate 212. The local wordline on signal pulse (WLON<m>) 176 is provided to memory array <m> 102m at the output of AND-gate 212. The inputs of OR-gate 214 are coupled to the output of AND-gate 212 and to the Q' output of flip-flop 232 of conflict block 202, and the output is coupled to the reset input (R) of flip-flop 210.

Sense amp block 164 receives WLON<m> 176 at the set input (S) of flip-flop 216 and generates the second tracking signal (Track_b<m>) at the Q output of flip-flop 216. Track_b<m> and the global sense amplifier on pulse (SA_ON) 178 are received at the inputs of AND-gate 218. The local sense amplifier on signal pulse (SAON<m>) 180 is provided to memory array <m> 102m at the output of AND-gate 218. The inputs of OR-gate 220 are coupled to the output of AND-gate 218 and to the Q' output of flip-flop 232 of conflict block 202, and the output is coupled to the reset input (R) of flip-flop 216.

Column select block 166 receives SAON<m> 180 at the set input (S) of flip-flop 222 and generates a local column select signal (RC_SEL<m>) 182 at the Q output of flip-flop 222. AND-gate 228 receives at its inputs global sense amplifier on signal pulse (SA_ON) 178 and the precharge timing signal pulse (PCH) 180. The inputs of AND-gate 224 receive the output of OR-gate 228 and RC_SEL<m> 182. The inputs of OR-gate 226 are coupled to the output of AND-gate 224 and the Q' output of flip-flop 232 of conflict block 202, and the output is coupled to the reset input (R) of flip-flop 222. NOR-gate 230 receives at its inputs SAOP<m> 186 from memory array <m> 102m and RC_SEL<m> 182 from flip-flop 222, and provides at its output SA_STOP<m>1 188 to memory array <m> 102m.

Figure 7A:
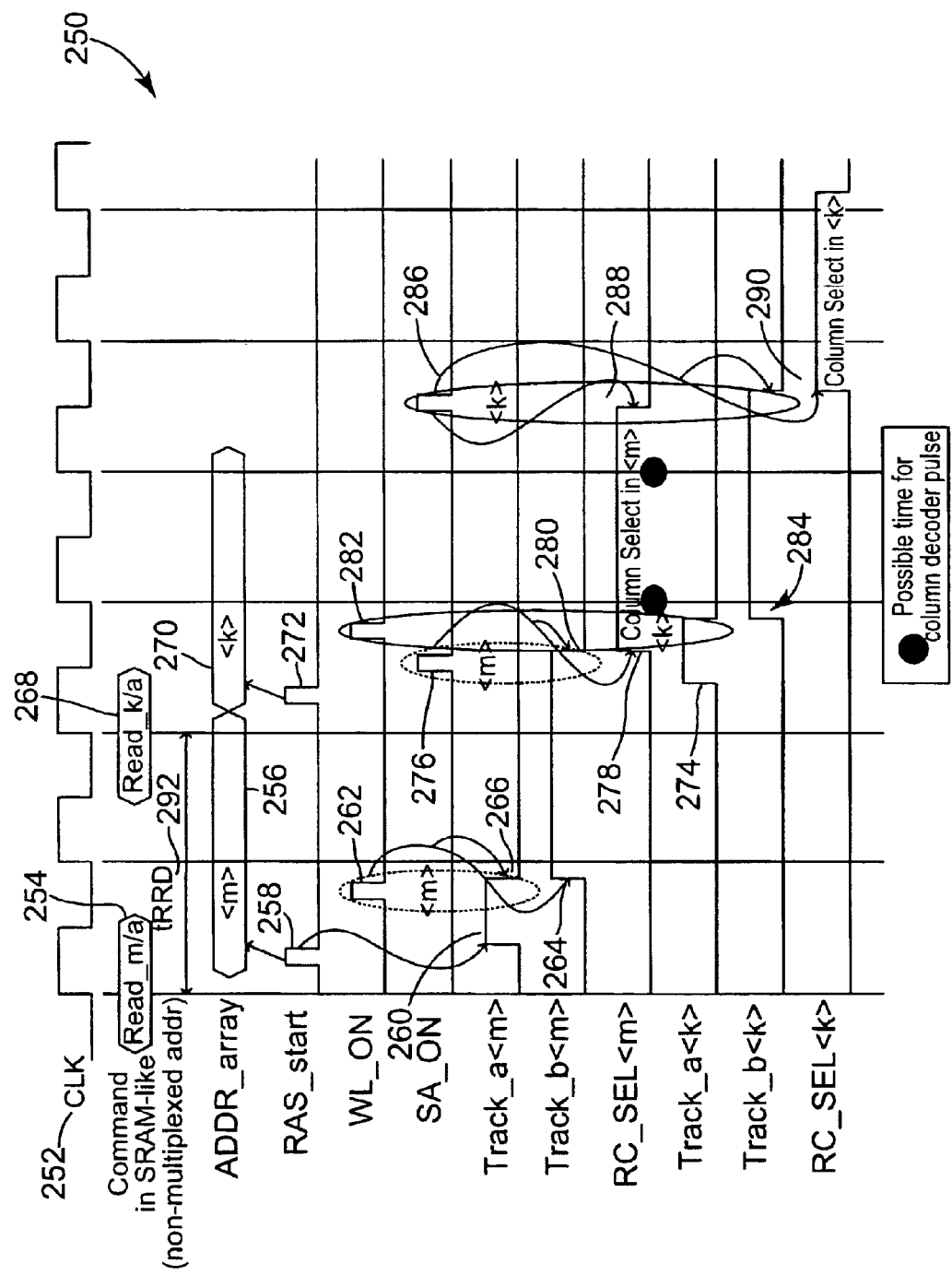
FIG. 7A is an exemplary timing diagram illustrating generally an example of the operation of a multiple array structure according to the present invention.
Figure 7B:
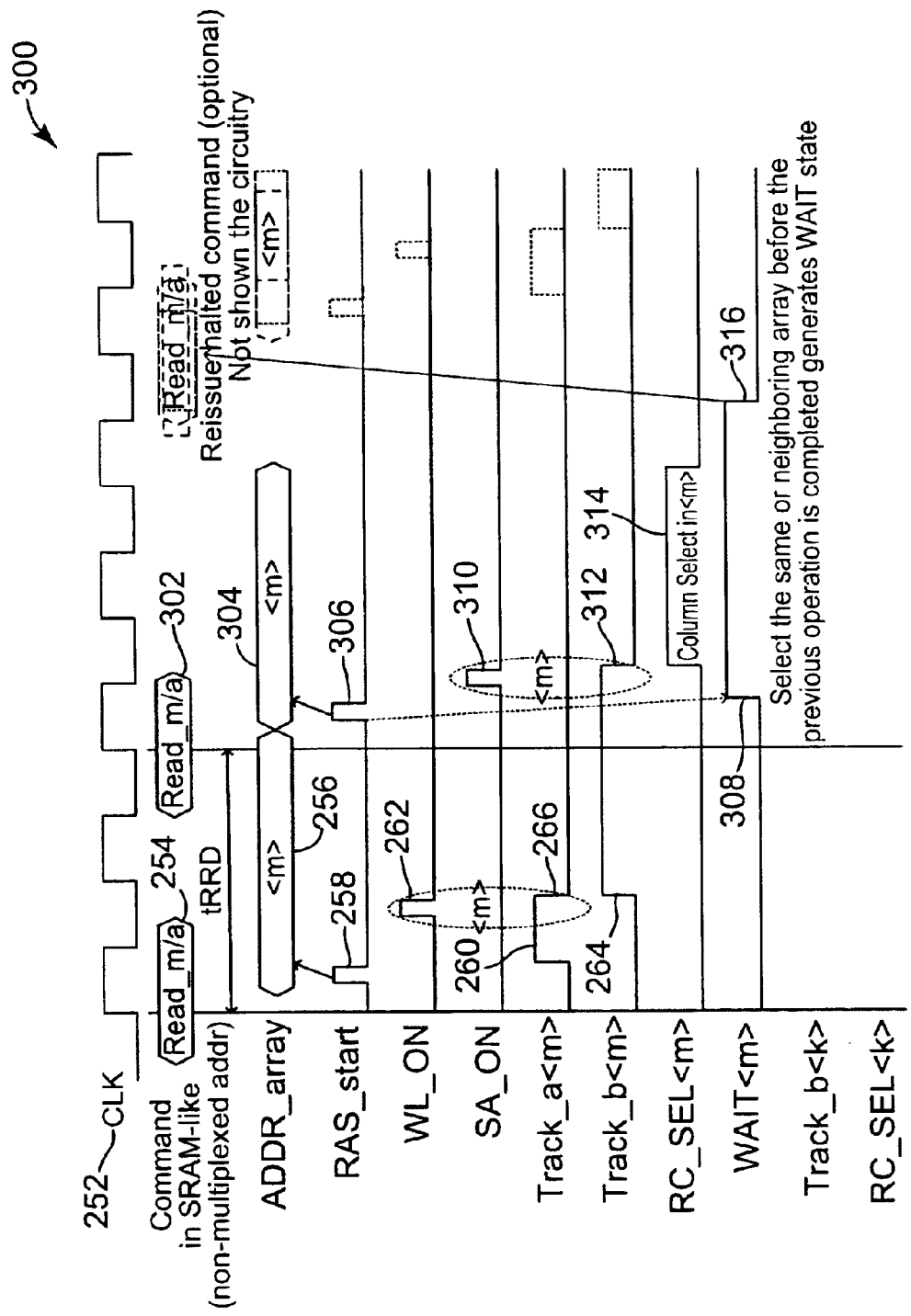
FIG. 7B is an exemplary timing diagram illustrating generally an example of the operation of a multiple array structure according to the present invention.

FIGS. 7A and 7B are example timing diagrams illustrating the operation of tracking circuit 122m of FIG. 6. FIG. 7A illustrates at 250 consecutive transactions to two memory arrays, memory array <m> 102m and an array <k> (not shown in FIG. 6), wherein array<m> and array<k> are different and non-adjacent memory arrays within memory bank <a> 104.

A system clock is illustrated at 252. The first of the consecutive transactions is a read operation of array <m> 102m (Read_m/a) as indicated at 254. Initially, a bank controller, such as bank controller 36, provides the array address (ADDR_array) for array <m> 102m as indicated at 256, which is received at an input to AND-gate 204. With ADDR_array 256 being the address for memory array <m> 102m, the output of AND-gate 204 is set "high". A global RAS_start pulse is then provided as indicated at 258. With the output of AND-gate 204 set "high", AND-gate 206 provides at its output a pulse in response to receiving RAS_start pulse 258. Assuming there is not an on-going prior transaction to memory array <m> 102m, the Q' output of flip-flop 232 is set "high". With the output Q' of flip-flop 232 set "high", AND-gate 208 provides a local RAS_act<m> pulse 172 to memory array <m> 102m.

Upon the falling edge of RAS_act<m> 172, the output Q of flip-flop 210 is set "high" as indicated by Track_a<m> at 260. With Track_a<m> set "high", tracking circuit 122m is the only tracking circuit within the memory bank structure that will provide a subsequent global WL_ON signal to its corresponding memory array. Thus, AND-gate 212, upon receipt of a subsequent global WL_ON signal pulse 262, provides local wordline on timing signal pulse (WLON<m>) 176 to memroy array <m> 102m, thereby activating a selected wordline in array <m> 102m. Upon the falling edge of the WLON<m> 176, the output Q of flip-flop 216 is set "high" as indicated by Track_b<m> at 264.

Also upon the falling edge of WLON<m> 176, the output Q of flip-flop 210 is reset "low" as indicated by Track_a<m> at 266. With Track_a<m> now set "low", tracking circuit 122m will not provide a subsequent global WL_ON signal pulse to memory array <m> 102m. At this point, a row operation can be initiated to another array within memory bank <a>, such as a read operation of memory array <k> (Read_k/a) as indicated at 268. To initiate Read_k/a 268, a global ADD_array signal for memory array <k> is issued via row bus 108 as indicated at 270. Upon receiving ADDR_array 270 for memory array <k>, a tracking circuit associated with array <k> (not shown, but identical to tracking circuit 122m) is the only tracking circuit that will provide subsequent global RAS_start pulse 272 to its associated array. In other words, only array <k> of the bank will respond to RAS_start pulse 272. In a fashion similar to that described above for array <m> 102m, the tracking circuit associated with array <k> generates a tracking signal Track_a<4> having a "high" level as indicated at 274.

With Track_b<m> set "high" at 264, tracking circuit 122m is the only tracking circuit within the memory bank structure that will provide a subsequent sense amplifier on timing signal pulse (SA_ON) to its corresponding memory array. Thus, AND-gate 218, upon receipt of a subsequent global SA_ON pulse 276, provides a local sense amplifier on timing signal pulse (SAON<m>) 180 to memory array <m> 102m. Upon receipt of SAON<m> 180, sense amplifier operations are initiated for memory array<m> 102m. Upon the falling edge of SAON<m> 180, the Q output of flip-flop 222 is set "high" to thereby provide a row select signal RC_SEL<m> to array <m> 102m having a "high" level, as indicated at 278, thereby activating a selected column for the bank. Also upon the falling edge of SAON<m> 180, the output Q of flip-flop 216 is reset "low" as indicated by Track_b<m> at 280.

At this point, with Track_a<k> set "high" as indicated at 274, a global WL_ON pulse 282 issued via row bus 108 causes a selected wordline to be activated in array <k>. The falling edge of WL_ON pulse 282 resets Track_a<k>"low" and sets Track_b<k>"high" as indicated at 284.

With Track_b<m> reset "low", tracking circuit 122m will not provide a subsequent global SA_ON signal pulse to memory array <m> 102m. Thus, with Track_b<k> set high, the next global SA_ON pulse 286 initiates sense amp operations for memory array <k>. The rising edge of SA_ON pulse 286, via OR-gate 228, AND-gate 224, and OR-gate 226 resets the Q output, and thus RC_SEL<m> "low" as indicated at 288. This marks the end of the column operations of array<m> 102m. Also upon the falling edge of SA_ON pulse 286, in a fashion similar to that of tracking circuit 122m for memory array <m>, Track_b<k> is set "low" and RC_SEL<k> is set "high", as indicated at 290, thereby activating a selected column for the bank.

Figure 1:
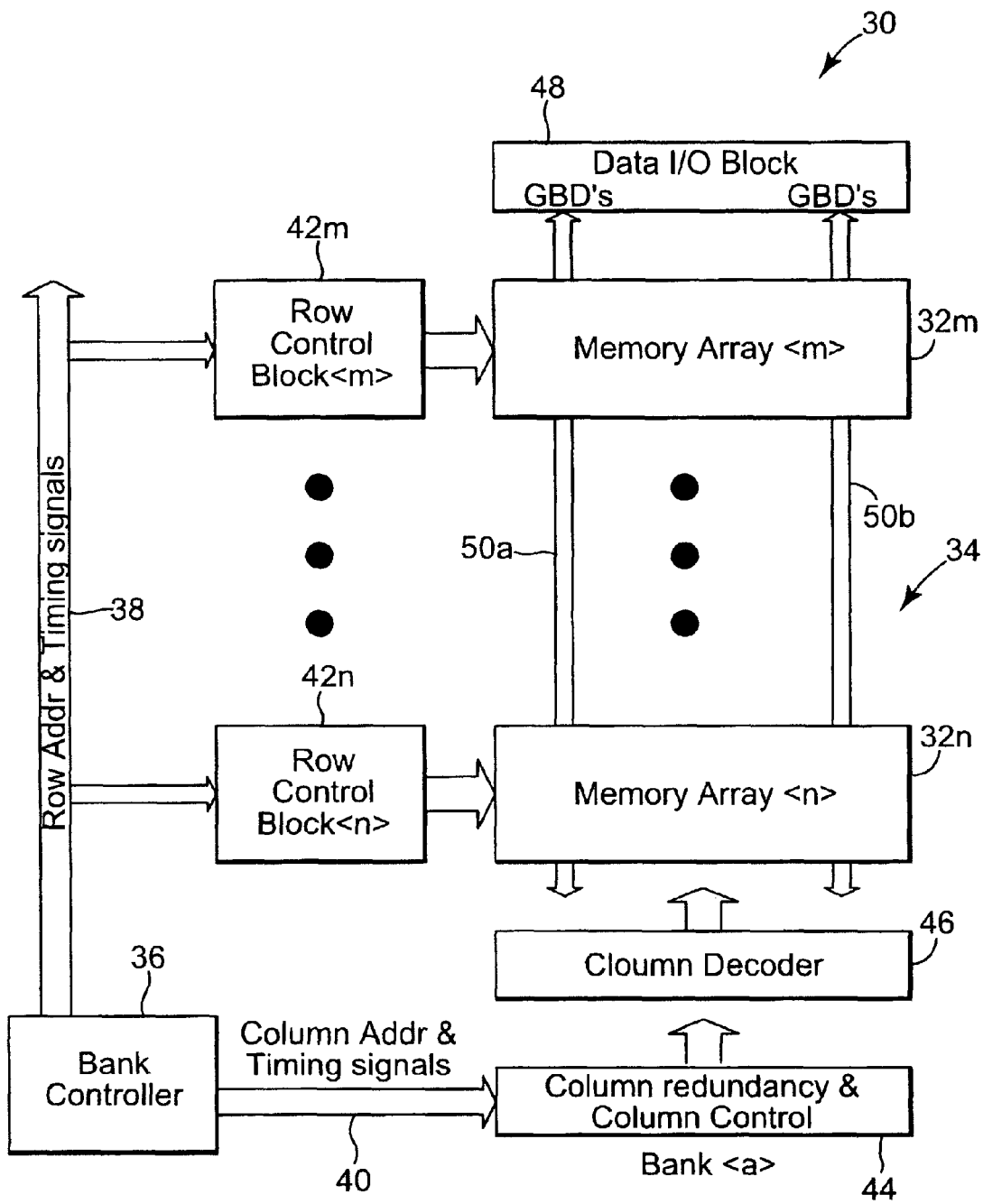
FIG. 1 is a block diagram illustrating generally an example of a convention multiple array memory structure.
Figure 2:
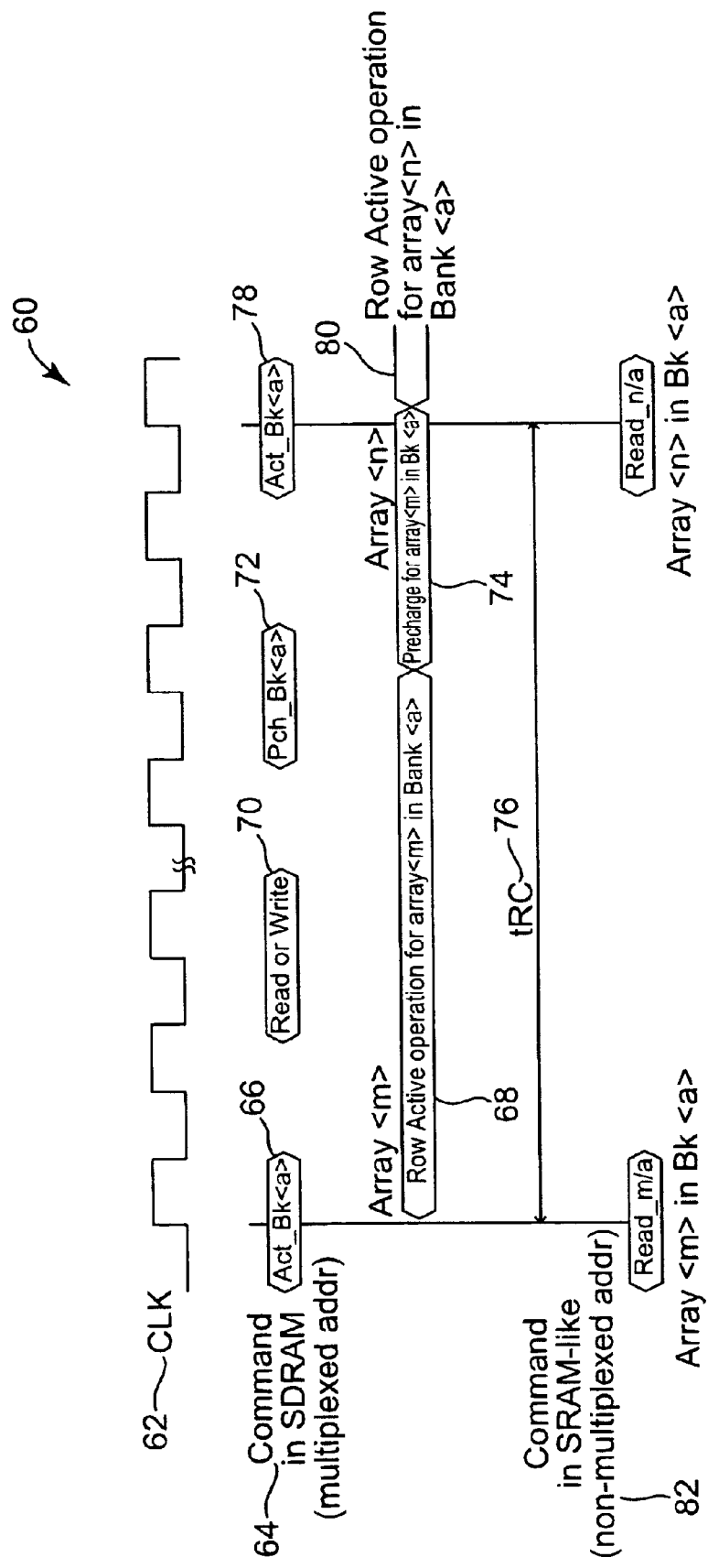
FIG. 2 is an exemplary timing diagram illustrating generally the operation of a conventional multiple memory array structure.

As can be seen by timing diagram 250 of FIG. 7A, the read operation 268 of memory array<k>, which is different from and not adjacent to memory array<m> 102m, can be intitated after time tRRD 292 and does not have to wait for the whole cycle time tRC 76 (see FIG. 2) to be completed. Instead, the read operation 268 of memory array<k> can overlap the read operation 254 of array <m> 102m.

FIG. 7B is a timing diagram 300 illustrating the operation of tracking circuit 122m of FIG. 6 when consecutive transactions are attempted to memory array <m> 102m. As before, a system clock is illustrated at 252. The first of the consecutive read operations of memory array <m> 102m is indicated at 254. Initially, the array address (ADDR_array) for memory array <m> 102m indicated at 256 is received at the inputs of AND-gate 204 resulting in the output of AND-gate 204 being set "high". A global RAS_start pulse is then provided as indicated at 258. With the output of AND-gate 204 set "high", AND-gate 206 provides at its output a pulse in response to receiving RAS_start pulse 258. Assuming there is not an on-going prior transaction to memory array <m> 102m, the Q' output of flip-flop 232 is set "high". With the output Q' of flip-flop 232 set "high", AND-gate 208 provides a local RAS_act<m> pulse 172 to memory array <m> 102m.

Upon the falling edge of local RAS_act<m> pulse 172, the output Q of flip-flop 210 is set "high" as indicated by Track_a<m> at 260. Also upon the falling edge of local RAS_act <m> pulse 172, the output Q of flip-flop 232 of conflict block 202 is set "high", resulting in one of the inputs to AND-gate 234 being set "high". This also sets the Q' output of flip-flop 232 "low" thereby disabling tracking circuit 122m from providing another local RAS_start<m> pluse 172 to array<m> 102m until the Q' output of flip-flop 232 is once again set "high".

With Track_a<m> set "high", tracking circuit 122m is the only tracking circuit within the memory bank structure that will provide a subsequent WL_ON pulse to its corresponding memory array. Thus, AND-gate 212, upon receipt of a subsequent global WL_ON pulse 262, provides local WLON<m> pulse 176 to memory array <m> 102m, thereby activating a selected wordline in memory array <m> 102m.

Upon the falling edge of the local WLON<m> pulse 176, the output Q of flip-flop 216 is set "high" as indicated by Track_b<m> at 264. Also upon the falling edge of WLON<m> 176, the output Q of flip-flop 210 is reset "low" as indicated by Track_a<m> at 266. With Track_a<m> now reset "low", tracking circuit 122m will not provide a subsequent global WL_ON signal pulse to memory array <m> 102m.

At this point, as indicated at 302, a second read operation of array<m> 102 in initiated. As with the first read operation at 254, the ADDR_array provides the array address for memory array <m> 102m, as indicated at 304. The array address is received at the inputs of AND-gate 204 resulting in the output of AND-gate 204 being set "high". A RAS_start pulse 306 is then provided which results in a similar pulse being generated at the output of AND-gate 206. With the output Q of flip-flop 232 set "high", AND-gate 234 provides a WAIT<m> signal 308 which informs the bank controller that there is an on-going transaction within memory array<m> 102m.

With Track_b<m> set "high" at 264, tracking circuit 122m is the only tracking circuit within the memory bank structure that will provide a subsequent global SA_ON signal pulse to its corresponding memory array. Thus, AND-gate 218, upon receipt of a subsequent global SA_ON pulse 310, provides local SAON<m> signal pulse 180 to memory array <m> 102m. Upon receipt of SAON<m> 180, sense amplifier operations are initiated for memory array<m> 102m.

Upon the falling edge of SAON<m> 180, the Q output of flip-flop 222 is set "high" to thereby provide a row select signal RC_SEL<m> to memory array <m> 102m having a "high" level, as indicated at 278, thereby activating a selected column for the bank. Also upon the falling edge of SAON<m> 180, the output Q of flip-flop 216 is reset "low"

as indicated by Track_b<m> at 312. With Track_b<m> now reset "low", tracking circuit 122m will not provide a subsequent global SA_ON signal pulse to memory array <m> 102m.

Upon completion of the operation in memory array <m> 102m, the local sense amplifier operation signal (SAOP<m>) goes "low" at one of the inputs to NOR-gate 230. At a predetermined time after SAOP goes "low", the bank controller provides a global precharge pulse (PCH) 184, which is received at one of the inputs to OR-gate 228, causing the output of OR-gate 228 to be set "high". With the out of OR-gate 228 set "high" and RC_SEL<m> still being "high", the output of AND-gate 224 is set "high".

With the output of AND-gate 224 set "high", the output of OR-gate 226 is set "high" causing flip-flop 222 of column select block 166 to be reset. When flip-flop 222 is reset, the Q output, and thus RC_SEL<m>, are set "low" thereby ending the column select operation in memory array <m> 102m.

Additionally, when the Q output go flip-flop 222 goes "low", the output of NOR-gate 230 is set "high" thereby providing the local SA_STOP<m> signal to memory array <m> 102m. Furthermore, the output of NOR-gate 230 being set "high" causes flip-flop 232 of conflict block 202 to be reset. When flip-flop 232 is reset the Q output goes "low" and the Q' output goes "high", thereby setting the local WAIT<m> signal at the output of AND-gate 234 "low" and enabling AND-gate 208 to provide a subsequent local RAS_act pulse 172 to be provided to memory array <m> 102m. At this point, another transaction to memory array <m> 102m can take place.

Figure 8:
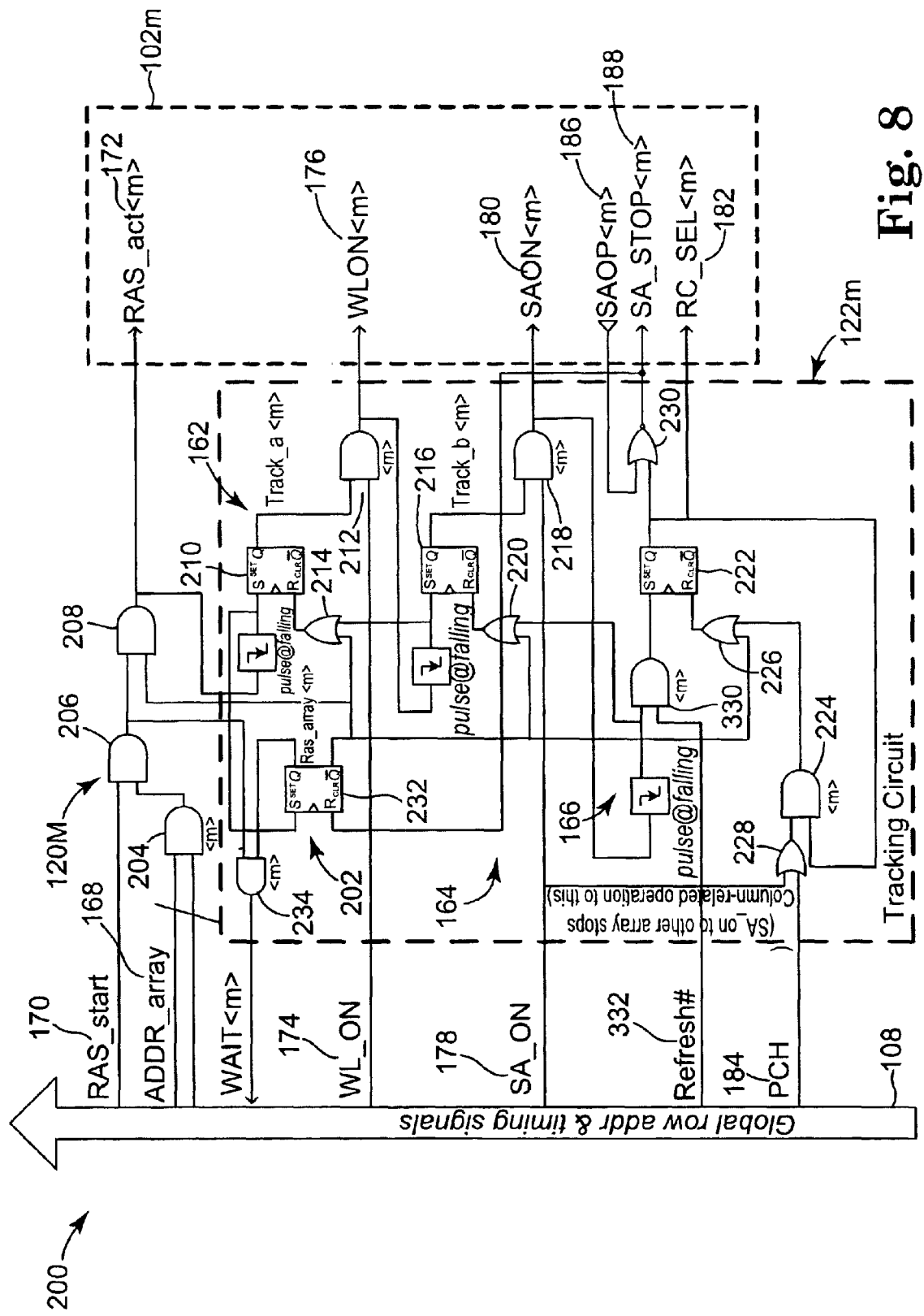
FIG. 8 is a schematic block diagram of one exemplary embodiment of a tracking circuit according to the present invention.

FIG. 8 is a schematic block diagram illustrating a portion of a semiconductor memory system 200 employing another exemplary embodiment of a tracking circuit 122m according to the present invention. Tracking circuit 122m of FIG. 8 is that same as that described in FIG. 6, except that column select block 166 further includes an AND-gate 330 prior to the set input (S) of flip-flop 222. The local SAON<m> pulse 180 is provided to a first input of AND-gate 330 and a refresh bar signal (Refresh#) 332 is provided to a second input of AND-gate 330. The output of AND-gate 330 is coupled to the set input (S) of flip-flop 222.

Based on the operation of tracking circuit 122m of FIG. 6 as described via the timing diagrams of FIGS. 7A and 7B above, tracking circuit 122m enables overlapping transactions to different and non-adjacent memory arrays within a bank structure. Thus, while one transaction is taking place in a first array, such as an array <k>, a second operation, such as a refresh operation can be initiated in array <m> 102m, which is different from and not adjacent to array <k>. However, a refresh operation does not require column selection and does not involve a data I/O transaction via data I/O block 116 and global data buses 118a/118b. Thus, in the case of a refresh operation, Refresh# signal 332 blocks the enabling of RC_SEL signal 182 via AND-gate 330 by preventing output Q of flip-flop 222 from being set "high".

By enabling overlapping transactions to different and non-adjacent memory arrays within memory array bank 104, a tracking circuit according to the present invention, such as tracking circuit 122m, increases the overall bandwidth of a semiconductor memory device employing a bank structure, such as semiconductor memory device 200.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor memory comprising:
    a bank of N arrays each having a corresponding array address;
    a bus providing an array address signal, a row address signal (RAS), and global timing signals; and
    N tracking circuits, each coupled between an associated different one of the N arrays and the bus, wherein a first tracking circuit, in response to receiving a first array address for a first array via the array address signal and a first active state of the RAS, couples the first array to the bus such that only the first array receives and responds to a first sequence of global timing signals associated with the first array address and first active state of the RAS and constituting a first bank transaction, and a second tracking circuit, in response to receiving a second array address for a second array via the array address signal and a second active state of the RAS, couples the second array to the bus such that only the second array responds to a second sequence of global timing signals associated with the second array address and second active state of the RAS and constituting a second bank transaction before the first bank transaction is complete.

2. The memory of claim 1, wherein the second array is different from and non-adjacent to the first array.

3. The memory of claim 1, wherein the semiconductor memory comprises a random access memory (RAM) device.

4. The memory of claim 1, wherein the semiconductor memory comprises a dynamic random access memory (DRAM) device.

5. The memory of claim 1, wherein each tracking circuit is further configured to provide a wait signal in response to receiving an array address of its associated array and an active state of the RAS prior to completion of an ongoing transaction to its associated array or an adjacent array.

6. A semiconductor memory comprising:
    a bank of N arrays each having a corresponding array address;
    a bus providing an array address signal, a row address signal (RAS), and timing signals; and
    N tracking circuits, each coupled between an associated different one of the N arrays and the bus, wherein a first tracking circuit, in response to receiving a first array address for a first array via the array address signal and a first active state of the RAS, couples the first array to the bus such that only the first array responds to a first sequence of timing signals constituting a first bank transaction, and a second tracking circuit, in response to receiving a second array address for a second array via the array address signal and a second active state of the RAS, couples the second array to the bus such that only the second array responds to a second sequence of timing signals constituting a second bank transaction before the first bank transaction is complete,
    wherein each tracking circuit comprises:
    a wordline block providing a first tracking signal having an active state in response to a local RAS having an active state representative of the array address signal having the array address of its associated array and to an active state of the RAS, and providing to its associated array a local wordline pulse in response to the first tracking signal having the active state and receiving a global wordline timing signal pulse via the bus;

a sense amp block providing a second tracking signal having an active state in response to the local wordline pulse, and providing to its associated array a local sense amp pulse in response to the second tracking signal having the active state and receiving a global sense amp timing signal pulse via the bus; and a column block providing to its associated array a local column select signal having an active state in response to the local sense amp pulse.

7. The memory of claim 6, wherein the wordline block comprises:

a flip-flop providing the first tracking signal having the active state in response to the local RAS having the active state; and an AND-gate providing the local wordline pulse in response to the global wordline timing pulse and the first tracking signal having the active state.

8. The memory array of claim 7, wherein the flip-flop sets the first tracking signal to an inactive state in response to the local wordline pulse.

9. The memory of claim 6, wherein the sense amp block comprises:

a flip-flop providing the second tracking signal having the active state in response to local wordline on pulse; and an AND-gate providing the local sense amp pulse in response to the global sense amp timing signal pulse and the second tracking signal having the active state.

10. The memory of claim 9, wherein the flip-flop sets the second tracking signal to an inactive state in response to the local sense amp pulse.

11. The memory of claim 6, wherein the column block comprises:

a flip-flop providing the local column select signal having the active state in response to the local sense amp pulse.

12. The memory of claim 11, wherein the flip-flop sets the local column select signal to an inactive state in response to a global precharge timing signal pulse or a global sense amp timing signal pulse when the local column select signal has the active state.

13. The memory of claim 12, wherein the column block further comprises:

a NOR-gate receiving the local column select signal and a sense amp operation signal indicating completion of sense amp operations to the associated array and providing a sense amp stop signal having an active state to the associated array in response to the local column select signal having the inactive state and the sense amp operation signal indicating completion of sense amp operation to the associated array.

14. The memory of claim 13, wherein the tracking circuit further comprises:

a conflict block providing a wait signal having an active state in response to the array address signal having the array address of its associated array and to the active state of the RAS prior to completion of an on-going transaction to its associated memory array.

15. The memory of claim 14, wherein the conflict block comprises:

a flip-flop providing an array operation signal having an active state representative of an ongoing transaction to its associated array; and an AND-gate providing the wait signal in response to the operation signal having the active state and to the active state of the RAS and the array address signal having the array address of its associated array.

16. The memory of claim 15, wherein the flip-flop sets the operation signal to an inactive state in response to the sense amp stop signal having the active state and causing the wait signal to have an inactive state.

17. A tracking circuit for a semiconductor memory including a bank of N memory arrays and a bus providing an array address signal, a row address signal (RAS), and global timing signals, the tracking circuit coupled between the bus and a first memory array and configured to couple the first memory array to the bus in response to receiving a first array address for the first memory array via the array address signal and an active state of the RAS such that the first memory array receives and responds to only a first sequence of global timing signals associated with the first array address and active state of the RAS and constituting a transaction with the first memory array, to enable a second sequence of global timing signals constituting a transaction with a second memory array in the bank to begin prior to completion of the transaction with the first memory array.

18. The circuit of claim 17, wherein the second memory array is different from and non-adjacent to the first memory array.

19. The circuit claim 17, wherein the semiconductor memory comprises a random access memory (RAM) device.

20. The circuit 17, wherein the semiconductor memory comprises a dynamic random access memory (DRAM) device.

21. The circuit of claim 17, wherein the tracking circuit is further configured to provide a wait signal in response to receiving an array address of the first memory array and the active state of the RAS prior to completion of an ongoing transaction with the first memory array or an adjacent memory array.

22. A tracking circuit for a semiconductor memory including a bank of N memory arrays and a bus providing an array address signal, a row address signal (RAS), and timing signals, the tracking circuit coupled between the bus and an associated memory array and configured to couple the associated memory array to the bus in response to receiving an array address for the associated memory array via the array address signal and an active state of the RAS such that the associated memory array responds to only a first sequence of timing signals constituting a transaction to the associated memory array, to enable a transaction constituting a second sequence of timing signals to second memory array in the bank to begin prior to completion of the transaction to the associated memory array, the tracking circuit comprising:

a wordline block providing a first tracking signal having an active state in response to a local RAS having an active state representative of the array address signal having the array address of its associated array and to an active state of the RAS, and providing to its associated array a local wordline pulse in response to the first tracking signal having the active state and receiving a global wordline timing signal pulse via the bus;

a sense amp block providing a second tracking signal having an active state in response to the local wordline pulse, and providing to its associated array a local sense amp pulse in response to the second tracking signal having the active state and receiving a global sense amp timing signal pulse via the bus; and a column block providing to its associated array a local column select signal having an active state in response to the local sense amp pulse.

23. The circuit of claim 22, wherein the wordline block comprises:
   a flip-flop providing the first tracking signal having the active state in response to local RAS having the active state; and
   an AND-gate providing the local wordline pulse in response to the global wordline timing pulse and the first tracking signal having the active state.

24. The circuit array of claim 23, wherein the flip-flop sets the first tracking signal to an inactive state in response to the local wordline pulse.

25. The circuit of claim 22, wherein the sense amp block comprises:
   a flip-flop providing the second tracking signal having the active state in response to local wordline on pulse; and
   an AND-gate providing the local sense amp pulse in response to the global sense amp timing signal pulse and the second tracking signal having the active state.

26. The circuit of claim 25, wherein the flip-flop sets the second tracking signal to an inactive state in response to the local sense amp pulse.

27. The circuit of claim 22, wherein the column block comprises:
   a flip-flop providing the local column select signal having the active state in response to the local sense amp pulse.

28. The circuit of claim 27, wherein the flip-flop sets the local column select signal to an inactive state in response to a global precharge timing signal pulse or a global sense amp timing signal pulse when the local column select signal has the active state.

29. The circuit of claim 28, wherein the column block further comprises:
   a NOR-gate receiving the local column select signal and a sense amp operation signal indicating completion of sense amp operations to the associated array and providing a sense amp stop signal having an active state to the associated array in response to the local column select signal having the inactive state and the sense amp operation signal indicating completion of sense amp operation to the associated array.

30. The circuit of claim 29, wherein the tracking circuit further comprises:
   a conflict block providing a wait signal having an active state in response to the array address signal having the array address of its associated array and to an active state of the RAS prior to completion of an on-going transaction to its associated memory array.

31. A method of increasing bandwidth of a semiconductor memory having a plurality of arrays each having an array address and a bus providing an array address signal, a row address signal (RAS), and global timing signals, the method comprising:
   coupling a first array of the plurality to the bus in response to the bus providing a first array address of the first array via the array address signal and a first active state of the RAS such that only the first array receives and responds to a first sequence of global timing signals associated with the first array address and first active state of the RAS and constituting a first bank transaction; and
   coupling a second array of the plurality to the bus in response to the bus providing a second array address of the second array via the array address signal and a second active state of the RAS such that only the second array receives and responds to a second sequence of global timing signals associated with the second array address and second active state of the RAS and constituting a second bank transaction before the first bank transaction is complete.

32. The method of claim 31, wherein the first and second arrays are different and non-adjacent arrays in a same memory array bank.

33. The method of claim 31, wherein the semiconductor memory comprises a dynamic random access memory (DRAM) device.

34. A method of increasing bandwidth of a semiconductor memory having a plurality of arrays each having an array address and a bus providing an array address signal, a row address signal (RAS), and timing signals, the method comprising:
   coupling a first array of the plurality to the bus in response to the bus providing an array address of the first array via the array address signal and a first active state of the RAS such that only the first array to the bus such that only the first array responds to a first sequence of timing signals constituting a first bank transaction;
   coupling a second array of the plurality to the bus in response to the bus providing an array address of the second array via the array address signal and a second active state of the RAS such that only the second array responds to a second sequence of timing signals constituting a second bank transaction before the first bank transaction is complete; and
   wherein coupling an array to the bus includes:
     providing a first tracking signal having an active state in response to a local RAS having an active state representative of the array address signal having the array address of its associated array and to an active state of the RAS, and providing to its associated array a local wordline pulse in response to the first tracking signal having the active state and receiving a global wordline timing signal pulse via the bus;
     providing a second tracking signal having an active state in response to the local wordline pulse, and providing to its associated array a local sense amp pulse in response to the second tracking signal having the active state and receiving a global sense amp timing signal pulse via the bus; and
     providing to its associated array a local column select signal having an active state in response to the local sense amp pulse.

* * * * *

UNITED STATES PATENT AND TRADEMARK OFFICE
CERTIFICATE OF CORRECTION

PATENT NO. : 6,985,398 B2 Page 1 of 1
APPLICATION NO. : 10/672120
DATED : January 10, 2006
INVENTOR(S) : Johg-Hoon Oh It is certified that error appears in the above-identified patent and that said Letters Patent is hereby corrected as shown below:

Column 2, line 60, delete "on" and insert in place thereof --one--.

Column 4, line 35, delete "responds" and insert in place thereof --respond--.

Column 7, line 22, delete "a<4>" and insert in place thereof --a<k>--.

Column 8, line 23, delete "pluse" and insert in place thereof --pulse--.

Column 8, line 41, delete "in initiated." and insert in place thereof --is initiated.--

Column 9, line 12, delete "out of" and insert in place thereof --output of--.

Column 9, line 36, delete "that same" and insert in place thereof --the same--.

Column 12, line 25, Claim 19, delete "circuit claim" and insert in place thereof --circuit of claim--.

Column 12, line 27, Claim 20, delete "circuit 17" and insert in place thereof --circuit of claim 17--.

Signed and Sealed this

Eighteenth Day of September, 2007

JON W. DUDAS
*Director of the United States Patent and Trademark Office*